United States Patent
Anderson

(10) Patent No.: US 11,480,596 B2
(45) Date of Patent: Oct. 25, 2022

(54) SYSTEMS AND METHODS FOR VERIFYING AND MAINTAINING ACCURACY OF METERING DEVICES

(71) Applicant: SCHNEIDER ELECTRIC USA, INC., Boston, MA (US)

(72) Inventor: David P. Anderson, Victoria (CA)

(73) Assignee: SCHNEIDER ELECTRIC USA, INC., Boston, MA (US)

(*) Notice: Subject to any disclaimer, the term of this patent is extended or adjusted under 35 U.S.C. 154(b) by 163 days.

(21) Appl. No.: 17/096,503

(22) Filed: Nov. 12, 2020

(65) Prior Publication Data

US 2022/0146556 A1    May 12, 2022

(51) Int. Cl.
*G01R 22/06* (2006.01)
*G01R 21/133* (2006.01)
*G01R 35/04* (2006.01)

(52) U.S. Cl.
CPC ......... *G01R 22/063* (2013.01); *G01R 21/133* (2013.01); *G01R 35/04* (2013.01)

(58) Field of Classification Search
CPC .... G01R 22/063; G01R 21/133; G01R 35/04; G01R 35/005; Y04S 20/30; G01D 4/004; G01D 4/08; Y02B 70/00
See application file for complete search history.

(56) References Cited

U.S. PATENT DOCUMENTS

| | | | |
|---|---|---|---|
| 7,272,518 B2 | 9/2007 | Bickel et al. | |
| 7,349,815 B2 | 3/2008 | Bickel et al. | |
| 7,937,247 B2 | 5/2011 | Carter et al. | |
| 9,709,604 B2* | 7/2017 | Driscoll | G01R 11/24 |
| 2004/0260526 A1* | 12/2004 | Hall | G06F 17/18 703/12 |
| 2016/0109497 A1* | 4/2016 | Aiello | H02J 13/00034 324/76.77 |

FOREIGN PATENT DOCUMENTS

| | | |
|---|---|---|
| CH | 231926 A | 4/1944 |
| CN | 106569167 A | 4/2017 |
| CN | 106597086 A | 4/2017 |
| CN | 211123238 U | 7/2020 |
| DE | 102009042330 A1 | 5/2011 |
| JP | H07306878 A | 11/1995 |

(Continued)

OTHER PUBLICATIONS

Extended European Search Report from corresponding European Application No. 21204439.0 dated Apr. 28, 2022.

(Continued)

*Primary Examiner* — Feba Pothen
(74) *Attorney, Agent, or Firm* — Lando & Anastasi, LLP

(57) ABSTRACT

Systems for identifying a meter that is out of calibration and methods of controlling the same include obtaining a power measurement value for each of a plurality of metering devices in a hierarchy of metering devices, calculating virtual metering points for a candidate metering device using metering devices connected upstream and/or downstream to the candidate metering device, and identifying the candidate metering device as being out of calibration by leveraging the virtual metering points and the candidate metering device's specification.

19 Claims, 4 Drawing Sheets

(56) References Cited

FOREIGN PATENT DOCUMENTS

JP          2012173265 A       9/2012
WO          WO-0105013 A2 *    1/2001   .......... H02J 13/0089

OTHER PUBLICATIONS

Liu Fangxing et al: "An Approachfor Online Smart Meter Error Estimation", 2020 Conference on Precision Electromagnetic Measurements (CPEM), IEEE, Aug. 24, 2020 (Aug. 24, 2020), pp. 1-2, XP033823600, DOI: 10.1109/CPEM49742.2020.9191736 [retrieved on Sep. 9, 2020].

Ming Liu et al: "Detection of Malfunctioning Smart Electricity Meter", arxiv.org, Cornell University Library, 201 Olin Library Cornell University Ithaca, NY 14853, Jul. 26, 2019 (Jul. 26, 2019), XP081449442.

* cited by examiner

SYSTEMS AND METHODS FOR VERIFYING AND MAINTAINING ACCURACY OF METERING DEVICES

BACKGROUND

Field

The present invention relates generally to systems and methods for determining, amongst a hierarchy of meters, a meter that needs calibration.

Discussion of Related Art

One-line diagrams (i.e., single line diagrams) are used to analyze power flow from sources to loads throughout an electrical distribution system. Power meters in such a distribution system may encounter accuracy drift over time. Current approaches to determining meter accuracy are focused on individual metering devices.

SUMMARY

Aspects and embodiments are directed to a method of identifying a meter that is out of calibration comprising acts of obtaining a power measurement value for each of a plurality of metering devices arranged in a hierarchy, the hierarchy including a plurality of levels with at least one of the plurality of metering devices in each of the plurality of levels, selecting a candidate metering device from one of the plurality of levels of the plurality of metering devices, calculating a plurality of comparison values for the candidate metering device based on the power measurement values of at least two metering devices of the plurality of metering devices excluding the candidate metering device, wherein at least one of the at least two metering devices is located in a different level in the hierarchy than the candidate metering device and the plurality of comparison values is calculated based on at least two different sets of one or more metering devices of the plurality of metering devices, calculating a difference value between the power measurement value of the candidate metering device and a first comparison value of the plurality of comparison values, and identifying the candidate metering device as being out of calibration based on the difference value.

In one example, method further comprises calculating the comparison value by summing the power measurement values of at least two metering devices of the plurality of metering devices.

In another example, the method further comprises in response to determining the difference value is within a tolerance, obtaining a new power measurement value for each metering device of the plurality of metering devices in the hierarchy.

In one example, identifying the candidate metering device as being out of calibration based on the difference value includes calculating an additional difference value between the power measurement value of the candidate metering device and an additional comparison value of the plurality of comparison values.

In another example, the method further comprises determining if the difference value and the additional difference value are positive or negative, and identifying an increased likelihood of the candidate metering device being out of calibration in response to determining the difference value and the additional difference value are both positive or both negative.

In one example, identifying the candidate metering device as being out of calibration based on the calculated difference value includes calculating an uncertainty value of the candidate metering device based on an accuracy value of the candidate metering device and the power measurement value of the candidate metering device, and calculating an uncertainty value of the comparison value.

In another example, the uncertainty value for the comparison value is calculated by calculating a sum-of-squares of a plurality of uncertainty values including the uncertainty value of the comparison value.

In one example, the method further comprises calculating a plurality of difference values including the difference value, calculating a plurality of uncertainty values including the uncertainty value of the comparison value, wherein identifying the candidate metering device as being out of calibration based on the difference value includes, determining whether a smallest difference value of the plurality of difference values exceeds a largest uncertainty value of the plurality of uncertainty values, and based on the determination, calculating an adjustment to a calibration constant of the candidate metering device.

In another example, the method further comprises adjusting the calibration constant of the candidate metering device in response to identifying the candidate metering device as being out of calibration.

In one example, the method further comprises issuing a calibration warning in response to identifying the candidate metering device as being out of calibration.

Aspects and embodiments are directed to a system for identifying a meter being out of calibration comprising a plurality of metering devices arranged in a hierarchy, the hierarchy including a plurality of levels with at least one of the plurality of metering devices in each of the plurality of levels, and a controller configured to obtain a power measurement value for each of the plurality of metering devices, select a candidate metering device from one of the plurality of levels of the plurality of metering devices, calculate a plurality of comparison values for the candidate metering device based on the power measurement values of at least two metering devices of the plurality of metering devices excluding the candidate metering device, wherein at least one of the at least two metering devices is located in a different level in the hierarchy than the candidate metering device and the plurality of comparison values is calculated based on at least two different sets of one or more metering devices of the plurality of metering devices, calculate a difference value between the power measurement value of the candidate metering device and a first comparison value of the plurality of comparison values, and identify the candidate metering device as being out of calibration based on the difference value.

In one example, the controller is further configured to calculate the comparison value by summing the power measurement values of at least two metering devices of the plurality of metering devices.

In another example, the controller is further configured to in response to determining the difference value is within a tolerance, obtain a new power measurement value for each metering device of the plurality of metering devices in the hierarchy.

In one example, the controller is further configured to calculate an additional difference value between the power measurement value of the candidate metering device and an additional comparison value of the plurality of comparison values.

In another example, the controller is further configured to determine if the difference value and the additional difference value are positive or negative, and identify an increased likelihood of the candidate metering device being out of calibration in response to determining the difference value and the additional difference value are both positive or both negative.

In one example, the controller is further configured to calculate an uncertainty value of the candidate metering device based on an accuracy value of the candidate metering device and the power measurement value of the candidate metering device, and calculate an uncertainty value of the comparison value.

In another example, the uncertainty value for the comparison value is calculated by calculating a sum-of-squares of a plurality of uncertainty values including the uncertainty value of the comparison value.

In one example, the controller is further configured to calculate a plurality of difference values including the difference value, calculate a plurality of uncertainty values including the uncertainty value of the comparison value, determine whether a smallest difference value of the plurality of difference values exceeds a largest uncertainty value of the plurality of uncertainty values, and based on the determination, calculate an adjustment to a calibration constant of the candidate metering device.

In another example, the controller is further configured to adjust the calibration constant of the candidate metering device in response to identifying the candidate metering device as being out of calibration, or issue a calibration warning in response to identifying the candidate metering device as being out of calibration.

Aspects and embodiments are directed to a non-transitory computer-readable medium storing sequences of instructions executable by at least one processor, the sequence of instructions instructing the at least one processor to execute a process of identifying a meter that is out of calibration, the sequences of instructions causing the at least one processor to perform operations comprising obtaining a power measurement value for each of a plurality of metering devices arranged in a hierarchy, the hierarchy including a plurality of levels with at least one of the plurality of metering devices in each of the plurality of levels, selecting a candidate metering device from one of the plurality of levels of the plurality of metering devices, calculating a plurality of comparison values for the candidate metering device based on the power measurement values of at least two metering devices of the plurality of metering devices excluding the candidate metering device, wherein at least one of the at least two metering devices is located in a different level in the hierarchy than the candidate metering device and the plurality of comparison values is calculated based on at least two different sets of one or more metering devices of the plurality of metering devices, calculating a difference value between the power measurement value of the candidate metering device and a first comparison value of the plurality of comparison values, and identifying the candidate metering device as being out of calibration based on the difference value.

Still other aspects, embodiments, and advantages of these exemplary aspects and embodiments are discussed in detail below. Embodiments disclosed herein may be combined with other embodiments in any manner consistent with at least one of the principles disclosed herein, and references to "an embodiment," "some embodiments," "an alternate embodiment," "various embodiments," "one embodiment" or the like are not necessarily mutually exclusive and are intended to indicate that a particular feature, structure, or characteristic described may be included in at least one embodiment. The appearances of such terms herein are not necessarily all referring to the same embodiment.

BRIEF DESCRIPTION OF THE DRAWINGS

Various aspects of at least one embodiment are discussed below with reference to the accompanying figures, which are not intended to be drawn to scale. The figures are included to provide illustration and a further understanding of the various aspects and embodiments, and are incorporated in and constitute a part of this specification, but are not intended as a definition of the limits of the invention. In the figures, each identical or nearly identical component that is illustrated in various figures is represented by a like numeral. For purposes of clarity, not every component may be labeled in every figure. In the figures.

DETAILED DESCRIPTION

Figure 1:
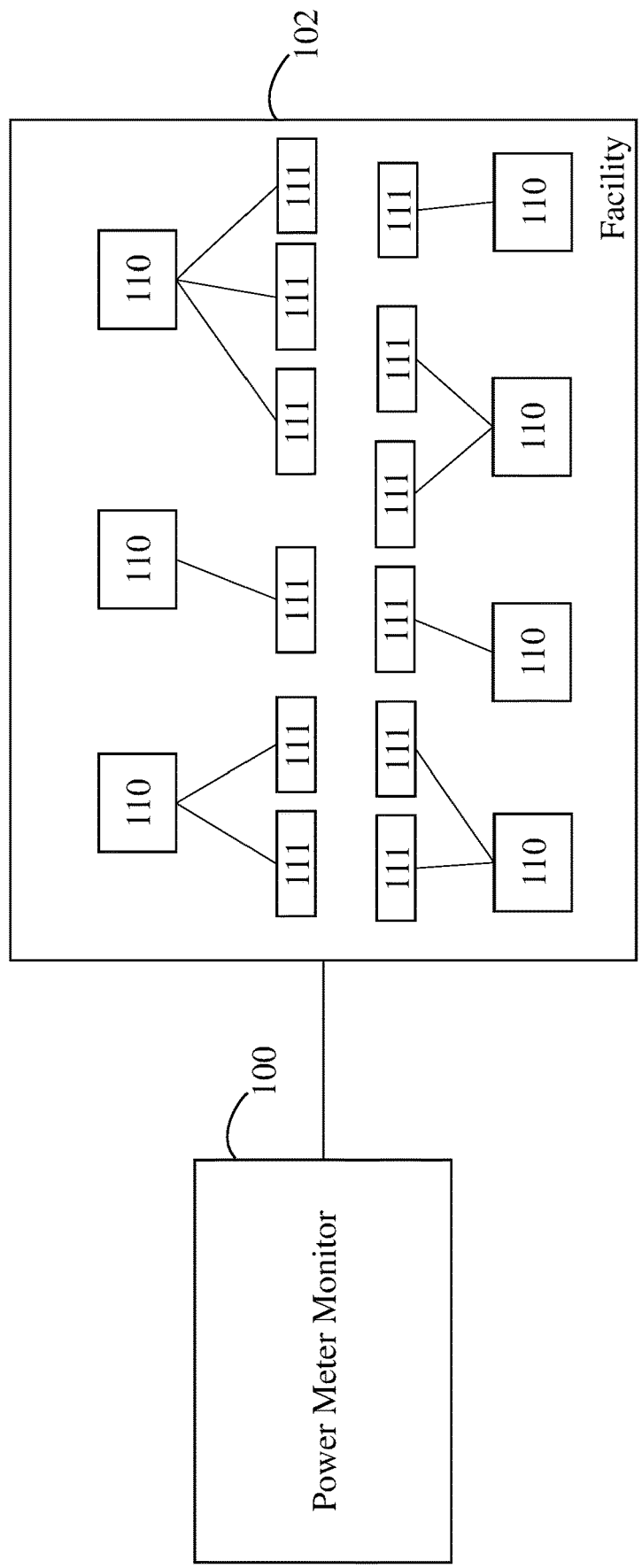
FIG. 1 is a block diagram of a power meter monitor in communication with plurality of power meters installed in a facility according to aspects described herein.

Examples of the methods and systems discussed herein are not limited in application to the details of construction and the arrangement of components set forth in the following description or illustrated in the accompanying drawings. The methods and systems are capable of implementation in other embodiments and of being practiced or of being carried out in various ways. Examples of specific implementations are provided herein for illustrative purposes only and are not intended to be limiting. In particular, acts, components, elements and features discussed in connection with any one or more examples are not intended to be excluded from a similar role in any other examples.

Also, the phraseology and terminology used herein is for the purpose of description and should not be regarded as limiting. Any references to examples, embodiments, components, elements or acts of the systems and methods herein referred to in the singular may also embrace embodiments including a plurality, and any references in plural to any embodiment, component, element or act herein may also embrace embodiments including only a singularity. References in the singular or plural form are not intended to limit the presently disclosed systems or methods, their components, acts, or elements. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms. In addition, in the event of inconsistent usages of terms between this document and documents incorporated herein by reference, the term usage in the incorporated references is supplementary to that of this document; for irreconcilable inconsistencies, the term usage in this document controls.

Power distribution networks can be arranged in a hierarchy such that a power grid feeds power to one or more distribution centers, which each in turn distribute power to lower level feeders. At any node in such a hierarchy, except for a lowest node, the amount of power at the node is ideally equivalent to the sum of all immediate child nodes. For example, if there is 100 watts of power measured at the grid and two child nodes with loads are connected to the grid, then it is understood that some percentage of the 100 watts is consumed by the loads at one child node while the remaining percentage of the 100 watts is consumed by the loads at the other child node, in an ideal scenario.

To monitor power usage at any node in such a hierarchy, a power meter is installed to report measurements to another device over a network. Each power meter is calibrated to obtain accurate readings. A problem exists where over time, despite a power meter being initially calibrated, the meter becomes uncalibrated (e.g., accuracy drift) to such a degree that the error between its measured reading and the actual value is too great to be usable. Users may not want to pull meters out of service for calibration. What is needed is a solution to determine a specific meter amongst a hierarchy of power meters in need of calibration. Embodiments described herein offer a self-verifying system for monitoring meter accuracy and provide a warning into long term drift characteristics of meter points.

FIG. 1 illustrates a power meter monitor 100 in communication with each power meter 110 of a plurality of power meters 110 within a facility 102. One or more loads 111 (e.g., motors) is electrically coupled to each of the meters 110. Accordingly, a power measurement of one meter 110 may be associated with more than one load 111, such that a meter 110 is configured to monitor one or more loads 111. In some examples, each power meter 110 is connected in a hierarchy as described above. To acquire one or more power measurements from each power meter 110, a controller (not shown) is configured to receive the one or more power measurements and retain them for further processing. In some examples, the controller is located within the power meter monitor 100. In other examples, the controller is located within the facility 102. To communicate with the power meters 110 remotely, in some examples, the controller is located externally to both the power meter monitor 100 and the facility 102. Additional examples include the controller connected to meters in a plurality of facilities, such as the facility 102. According to certain aspects, one or more of the power measurements from the power meters 110 are received on the controller directly from the meters 110, or indirectly (e.g., through a gateway between the meters 110 and the controller). In one embodiment, a head-end or main meter receives or collects data from meters 110 downstream from the main meter, and the main meter provides the received or collected data to the controller.

Figure 2:
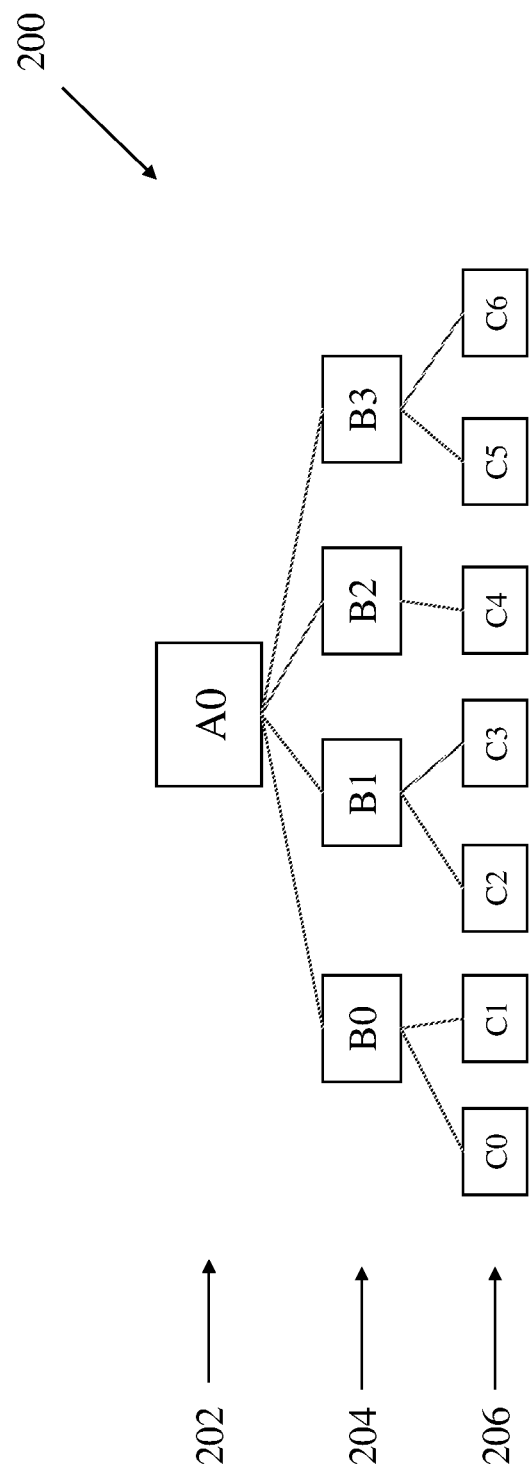
FIG. 2 is a block diagram of a hierarchy of connected power meters according to aspects described herein.

FIG. 2 illustrates a hierarchy of power meters generally indicated at 200 (e.g., similar to the hierarchy of the power meters 110 described above). The hierarchy includes three levels, including a top level 202, a middle level 204, and a bottom level 206. The top level includes a top node A0 that includes a power meter measuring power of a power grid. The top node A0, as illustrated in FIG. 2, is the only node in the top level in the hierarchy 200. The second level 204 includes a plurality of nodes B0, B1, B2, and B3 each having a power meter. The bottom level 206 of the hierarchy includes nodes C0, C1, C2, C3, C4, C5 and C6 each having a power meter. In the bottom level 206 of the hierarchy 200, the nodes C0 and C1 are both connected to B0, the nodes C2 and C3 are connected to the node B1, the node C4 is coupled to B2, and the nodes C5 and C6 are coupled to B3. It is understood that the hierarchy 200 is one of many possible hierarchies of power meters and other hierarchies with different numbers of meters at each level and connected to each node are contemplated. Additionally, it is understood that each node of the nodes in the hierarchy 200 may have one or more loads (e.g., similar to the loads 111) electrically coupled to the node such the power meter at the node is configured to monitor one or more of the coupled loads.

To determine which meter amongst the plurality of meters in the hierarchy 200 needs recalibrating, the dependent nature between parent nodes and child nodes in the hierarchy 200 is leveraged to produce multiple calculations for the same power measurement at a given node. In an example, at a given moment in time a power measurement is acquired from each node in the hierarchy 200. While simply acquiring a power reading from the meter at node B0 is one approach to determining the amount of power at the node B0, relying on B0's own meter is prone to accuracy drift causing an unreliable reading. Additional calculations can be performed to more accurately determine the amount of power at B0 using other nodes that are directly connected to B0. Each ideally equivalent measurement value for B0 (e.g., A0−(B1+B2+B3)) is treated as a virtual metering point or comparison value in the hierarchy 200 and can be used to verify the accuracy of the measurement of B0.

To investigate the hierarchy 200, each available node reading is acquired. Next, a plurality of comparison values is calculated for each reading, thereby creating multiple virtual measurement of each node reading. For each comparison value, an error or difference value is calculated with its corresponding node reading. Using the hierarchy 200 as an example, a first comparison value for B1 is: $B1_{comp1}=(A0-(B0+B2+B3))$. A second comparison value is $B1_{comp2}=C2+C3$. A first difference value for B1 is: $(B1_{comp1}-B1)/(B1)$. A second comparison value for B1 is: $(B1_{comp2}-B1)/(B1)$. This process is repeated for each node in the hierarchy 200.

Figure 3:
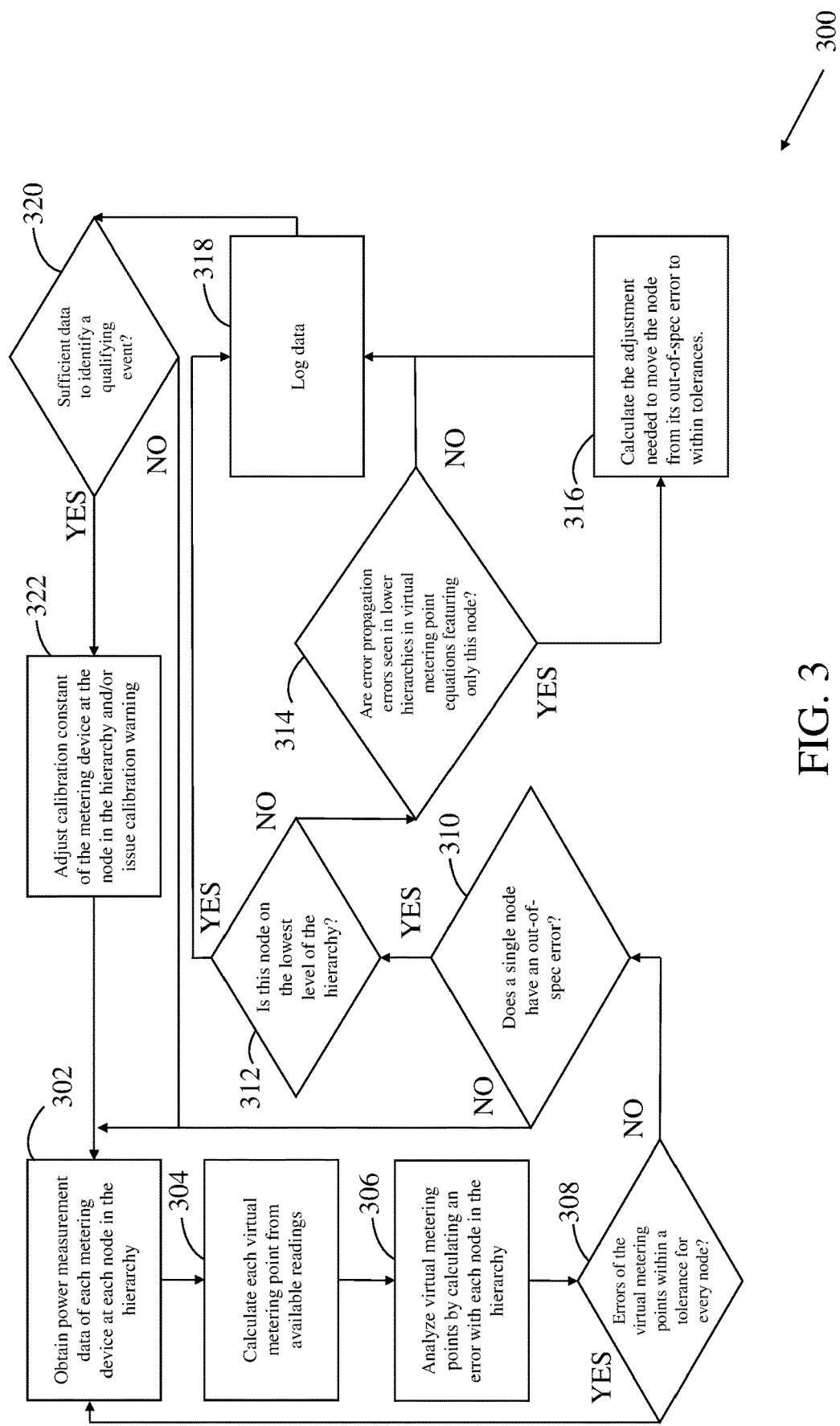
FIG. 3 is a flowchart for identifying a metering device in need of calibration according to aspects described herein.

FIG. 3 illustrates a logic flow generally indicated at 300 for identifying a metering device needing recalibrating including the acts of Act 302, Act 304, Act 306, Act 314, Act 316, Act 318, and Act 322, and the conditions of Condition 308, Condition 310, Condition 312, Condition 314, and Condition 320. According to certain aspects, each act and condition of the logic flow 300 is performed by one or more processors. The one or more processors may implement the logic flow 300 remotely over a network in communication with a hierarchy of power meters.

The logic flow 300 commences with the Act 302, where a power measurement/reading is obtained for each available metering device/node in a hierarchy of power meters (e.g., similar to the hierarchy 200). In some examples, each of these measurements is acquired simultaneously. In other examples, each measurement is obtained within a predefined time period. Still further, other examples include obtaining a time-averaged value of multiple measurements for each meter over a predefined period of time. In one example, the measurements are obtained when the hierarchy of power meters has reached a steady state or stable condition. It is understood that each power measurement obtained in the Act 302 may be associated with more than one load electrically coupled to the respective meter that provides the power measurement.

After each available power measurement is obtained in the Act 302, in the Act 304 a plurality of virtual metering points or comparison values is generated by using different equations that are theoretically equal to one another in a perfect, error-free and lossless system, thereby performing multiple virtual measurements of a given power reading for a metering device in the hierarchy.

In the Act 306, the plurality of comparison values is analyzed by calculating an error or difference value between each comparison value and the corresponding power measurement for a given metering device. In an example, a reading of the given metering device is 100.0 Watts, a first comparison value of the metering device is 100.2 Watts, and a second comparison value of the metering device is 100.1 Watts. The error for the first comparison value is thus 0.2% and the error for the second comparison value is 0.1%. This process is repeated for each virtual metering point.

To determine if further analysis is needed, in the Condition 308, each comparison value is checked to be within a tolerance of the corresponding meter's reading. Keeping with the example described above, if the tolerance of the comparison values for the given metering device described in the Act 306 was specified to be within 0.3% of the meter's reading, then the Condition 308 would indicate 'YES.' One example of determining the tolerance includes analyzing the measurement uncertainties (discussed in more detail below) of the meters that contribute to each virtual metering point for the given metering device, where larger measurement uncertainties dictate larger tolerances and smaller measurement uncertainties dictate smaller tolerances. According to certain aspects, each level in the hierarchy has a different tolerance. In an example, the tolerance increases as the level becomes farther away from the highest node. In another example, the tolerance of each node is based on the load(s) at the node.

Having determined that some metering device in the hierarchy may need calibration (i.e., the Condition 308 indicates 'NO'), the errors analyzed in the Act 306 are processed in the Condition 310 to determine if a single candidate node in the hierarchy has out-of-spec errors in a same direction (i.e., positive or negative error) for all virtual metering points using the single node in their calculations. According to certain aspects of the Condition 308, all such virtual metering points reporting a different value than the reading of the single node indicate 'YES' in addition to any other requirements. Using FIG. 2 as an example, and assuming node B1 is potentially out-of-spec and needing calibration, comparison values for B1 using nodes connected to B1 in the top level 202 and the bottom level 206 are examined In this example, B0 has a reading of 50.25 Watts, a first comparison value of 50 Watts (e.g., A0−(B0+B2+B3)), and a second comparison value of 49 Watts (e.g., A0−(C0+C1+C4+C5+C6)). The difference value of the first comparison value is −0.50%, which is in the negative direction. The difference value of the second comparison value is −2.49%, which is in the negative direction. Therefore, the comparison values for B1 are in the same direction.

Before proceeding to further analysis, measurement uncertainty is considered. The above example indicates B1 has difference values in the same direction for all virtual metering points of nodes directly connected to B1 and that use B1 in their calculations. The difference values of the directly connected nodes and B1 are evaluated to see if the difference values exceed each node's measurement uncertainty. Measurement uncertainty is linked to the specification of the individual meter/node. In an example, for a given metering device, the specification indicates a ±0.2% accuracy at 500 Watts. Accordingly, the metering device has a value of ±1 Watt of uncertainty or ±0.2% uncertainty. If the metering device is the only node being used in a comparison value calculation, then then the uncertainty value is calculated as discussed above. However, if a comparison value uses multiple meter readings, then each reading's value is considered. Using the hierarchy 200 as an example and nodes A0, B1, B2, and B3 having uncertainty values of 0.1%, 0.2%, 0.2%, and 0.2% respectively, a comparison value for B0 is: A0−(B1+B2+B3). Accordingly, the uncertainty value of B0's comparison value is: $\sqrt{((0.001^2)+(0.002^2)+(0.002^2)+(0.002^2))}=0.36\%$ (i.e., add the squares of all the uncertainties). If the largest uncertainty value amongst all the comparison values for B0 is less than the smallest difference value, then the Condition 310 indicates 'YES.' Should no node satisfy this condition, the Condition 310 indicates 'NO.' Any uncertainty values or difference values being repeated are treated as a single value for comparison purposes.

In the Condition 312, the node that successfully passed the Condition 310 is further evaluated. If this node is in the lowest level of the hierarchy (e.g., in the level 206 in FIG. 2), then the logic process 300 proceeds to the Act 318 and the measurement is logged for future use since there are no nodes below it to validate its measurement and potentially increase the likelihood that the node definitively needs recalibration. Using FIG. 2 as an example, since B1 is not in the lowest level, the Condition 312 would be 'YES.'

In the Condition 314, nodes connected downstream from the given node that passed (i.e., 'NO') the Condition 312 are processed. In these downstream nodes, a particular pattern is sought. If the given node is likely in need of re-calibrating, then those virtual metering points for downstream nodes that use the actual reading of the given node should exhibit a significant difference value or error. As an example, one possible comparison value for C2 from the hierarchy 200 is calculated as: B1−C3. If this comparison value is 0.00% or substantially near 0.00%, then the Condition 314 indicates 'NO' and the error is logged for future use. In one example the significant difference value of the downstream node is at least as large (for positive error) or small (for negative error) as the difference value of the given node.

In the Act 316, the adjustment needed to move the node processed in the Act 314 from its out-of-spec error to within an acceptable tolerance is calculated. The known error for this node is calculated by taking the difference between the reading for the node and the closest comparison value accounting for measurement uncertainty. In an example, the node measures 50.25 Watts. The closest comparison value is 48 Watts having a ±0.2% measurement uncertainty value. From a visual perspective, the measurement uncertainty values provide 'error bars' around the measurement values. In this example, the right error bar of the comparison value would have a value of 48.10 Watts. The known error is therefore +2.15 Watts or +4.28% of the node's reading.

In the Act 318, the measurement data for the node and corresponding comparison value data is logged for further use. Should the logic process 300 reach the Condition 316, then at the Condition 320, it is likely that the node is in need of calibration and in the Act 322, the known error calculated from the Act 316 is used to adjust a calibration constant of the node, thereby improving its accuracy, and/or issue a calibration warning. The calibration constant (i.e., calibration factor) is a percent of the full-scale response of a particular power meter. In some examples, the calibration constant varies from approximately 80% to approximately 100% for the particular meter. If the logic process 300 determines in the Condition 320 that amongst the one or more loads at a given node, that the power meter measuring power at the given node is sufficiently out-of-spec, then its calibration constant is adjusted accordingly to bring the meter back into an acceptable range based on the known error in the meter. It is contemplated in embodiments herein that other parameters besides power (e.g., voltage) are analyzed in the logic flow 300 to verify and maintain accuracy of metering devices.

A qualifying event includes a confident determination that calibration is required or highly suggested. In some examples, a user does not want to recalibrate any meters until approving the change. Accordingly, only a calibration warning is issued, while in other examples, a calibration is automatically initiated. In an example of calibrating the node, the node's power calibration constant is reduced or increased by the percentage of known error. In an example, if a metering device is adjusted by +1.0%, then a reading of 100 Watts would instead be adjusted according to: (calibration constant)*(node reading), which in this case, adjusts a node reading of 1*100 Watts to 1.01*100 Watts, which is 101 Watts. In some embodiments, the Condition 320 determines whether the same node has reached the Act 316 a predetermined number of times before indicating 'YES,' thereby increasing confidence or likelihood in the decision to calibrate.

In some embodiments, a specific gain stage in the metering device being analyzed is determined as needing calibration. According to certain aspects, after logging sufficient data or a number of measurement points of a metering device/node during a time interval, and assuming the average power consumed at the node is constant for the time interval, the number and type of voltage gain stages and current gain stages in the metering device is determined. In an example, the metering device has a switch point in its gain stages at 5 Amps. If the logged data indicates the metering device needs recalibrating, and current conducted by the metering device is more than 5 Amps during the interval, then the higher current gain stage is calibrated, thereby avoiding calibrating other gain stages that are not in need of calibration.

To increase the likelihood or confidence in deciding to calibrate a meter in the Condition 320, certain embodiments include acquiring voltage, current, and/or power factor measurements in addition to power measurements in the Act 302, which are then recorded or logged in the Act 318. In an example, a qualifying event includes determining the meter has an out-of-spec error in the Condition 310, and additionally determining the meter has had stable voltage measurements over a period of time or number of samples. Stable voltage measurements include, in one example, a plurality of voltage measurements from the meter within a tolerance. In an example, stable voltage measurements are indicated by the plurality of voltage measurements deviating from an average value of the meter's voltage measurements by less than 1% of the average value. The average value is calculated over the period of time, the number of samples, or a different range of values.

According to certain aspects, the Condition 320 includes determining whether a predetermined period of time (or a predetermined number of samples) without meter measurements has occurred for a given meter. In an example, the predetermined period is a planned break in metering. In one example, the planned break is a firmware upgrade. In another example, the lack of meter measurements in the predetermined period is caused by a power outage affecting the given meter. In response to determining no meter measurements, or fewer than a predetermined number of meter measurements have been acquired for the given meter during the predetermined period of time, an average of the most recent virtual measurements for the given meter is calculated to log measurement data for the given meter while it is offline, thereby replacing the missing data. In an example, the period of the most recent measurements up to the point when the given meter went offline includes at least the same length of time as the predetermined period.

Figure 4:
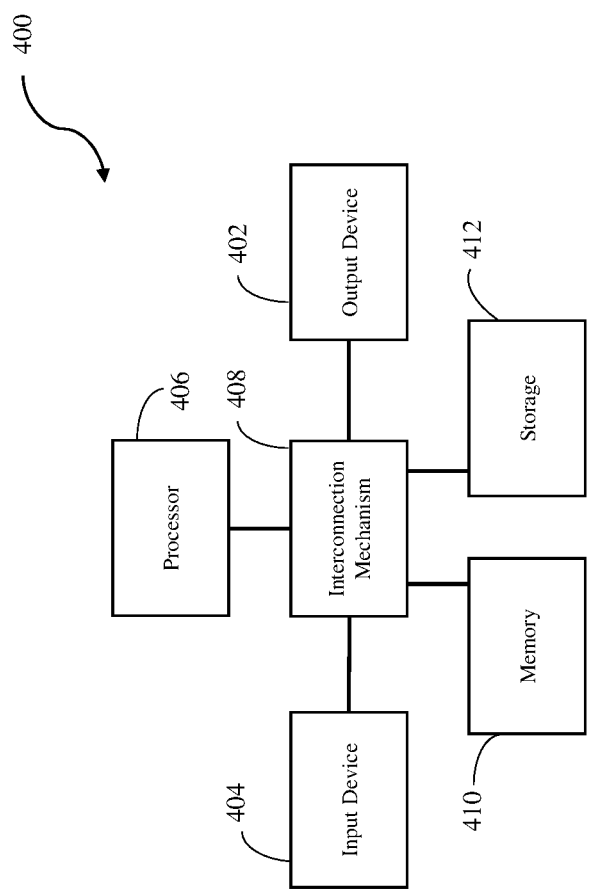
FIG. 4 is block diagram of a system upon which various embodiments of the invention may be implemented.

FIG. 4 illustrates an example block diagram of computing components forming a system 400 which may be configured to implement one or more aspects disclosed herein. For example, the system 400 may be communicatively coupled to a controller (e.g., similar to the controller described above) or included within the controller. The system 400 may also be configured to operate a power meter monitor (e.g., similar to the power meter monitor 100) and/or implement the logic flow 300 as processor-executable instructions. The logic flow process 300, in some embodiments is fully automated.

The system 400 may include for example a computing platform such as those based on Intel PENTIUM-type processor, Motorola PowerPC, Sun UltraSPARC, Texas Instruments-DSP, Hewlett-Packard PA-RISC processors, or any other type of processor. System 400 may include specially-programmed, special-purpose hardware, for example, an application-specific integrated circuit (ASIC). System 400 may also include a Field Programmable Gate Array (FPGA). Various aspects of the present disclosure may be implemented as specialized software executing on the system 400 such as that shown in FIG. 4.

The system 400 may include a processor/ASIC 406 connected to one or more memory devices 410, such as a disk drive, memory, flash memory or other device for storing data. Memory 410 may be used for storing programs and data during operation of the system 400. Components of the computer system 400 may be coupled by an interconnection mechanism 408, which may include one or more buses (e.g., between components that are integrated within a same machine) and/or a network (e.g., between components that reside on separate machines). The interconnection mechanism 408 enables communications (e.g., data, instructions) to be exchanged between components of the system 400. The system 400 also includes one or more input devices 404, which may include for example, a keyboard or a touch screen. The system 400 includes one or more output devices 402, which may include for example a display. In addition, the computer system 400 may contain one or more interfaces (not shown) that may connect the computer system 400 to a communication network, in addition or as an alternative to the interconnection mechanism 408.

The system 400 may include a storage system 412, which may include a non-transitory computer-readable medium in which signals may be stored to provide a program to be executed by the processor or to provide information stored on or in the medium to be processed by the program. The non-transitory computer-readable medium may, for example, be a disk or flash memory and in some examples may include RAM or other non-volatile memory such as EEPROM. In some embodiments, the processor may cause data to be read from the non-volatile medium into another memory 410 that allows for faster access to the information by the processor/ASIC than does the medium. This memory 410 may be a volatile, random access memory such as a dynamic random access memory (DRAM) or static memory (SRAM). It may be located in storage system 412 or in memory system 410. The processor 406 may manipulate the data within the integrated circuit memory 410 and then copy the data to the storage 412 after processing is completed. A variety of mechanisms are known for managing data movement between storage 412 and the integrated circuit memory element 410, and the disclosure is not limited thereto. The disclosure is not limited to a particular memory system 410 or a storage system 412.

The system 400 may include a computer platform that is programmable using a high-level computer programming language. The system 400 may be also implemented using specially programmed, special purpose hardware, e.g. an ASIC. The system 400 may include a processor 406, which may be a commercially available processor such as the well-known Pentium class processor available from the Intel Corporation. Many other processors are available. The processor 406 may execute an operating system which may be, for example, a Windows operating system available from the Microsoft Corporation, MAC OS System X available from Apple Computer, the Solaris Operating System available from Sun Microsystems, or UNIX and/or LINUX available from various sources. Many other operating systems may be used.

The processor and operating system together may form a computer platform for which application programs in high-level programming languages may be written. It should be understood that the disclosure is not limited to a particular computer system platform, processor, operating system, or network. Also, it should be apparent to those skilled in the art that the present disclosure is not limited to a specific programming language or computer system. Further, it should be appreciated that other appropriate programming languages and other appropriate computer systems could also be used.

Current power meters used in hierarchical configurations can require periodic calibration, particularly lower cost meters. There is a growing need to rely on the measurement data of lower cost meters to allocate power costs to groups of loads or individual loads. In many cases, frequent calibrations are used to ensure valid measurements. These frequent calibrations may in many instances by unnecessary, if a meter is operating within specifications, and they may result in downtime for the meter. This is a technical problem. In at least one embodiment described herein, a metering control system includes improvements over prior systems and is directed to solving this technical problem by reducing the number of calibrations required and at the same time improving the overall accuracy of the meter control system. This technical solution is not routine and is unconventional. This technical solution is a practical application of power meters that solves the foregoing technical problem and constitutes an improvement in the technical field.

Additional advantages are provided by at least one embodiment described herein. By efficiently identifying a meter needing recalibrating, a self-verifying metering system is provided that stores and tracks calibration events over time, providing data for high-level analysis of a hierarchical power system. Such data is beneficial to supplement and enhance other power monitoring systems.

Having thus described several aspects of at least one embodiment of this invention, it is to be appreciated various alterations, modifications, and improvements will readily occur to those skilled in the art. Such alterations, modifications, and improvements are intended to be part of this disclosure, and are intended to be within the spirit and scope of the invention. Accordingly, the foregoing description and drawings are by way of example only.

What is claimed is:

1. A method of identifying a meter that is out of calibration comprising acts of:
obtaining a power measurement value for each of a plurality of metering devices arranged in a hierarchy, the hierarchy including a plurality of levels with at least one of the plurality of metering devices in each of the plurality of levels;
selecting a candidate metering device from one of the plurality of levels of the plurality of metering devices;
calculating a plurality of comparison values for the candidate metering device based on the power measurement values of at least two metering devices of the plurality of metering devices excluding the candidate metering device, wherein at least one of the at least two metering devices is located in a different level in the hierarchy than the candidate metering device and the plurality of comparison values is calculated based on at least two different sets of one or more metering devices of the plurality of metering devices;
calculating a difference value between the power measurement value of the candidate metering device and a first comparison value of the plurality of comparison values; and
identifying the candidate metering device as being out of calibration based on the difference value by: calculating an additional difference value between the power measurement value of the candidate metering device and an additional comparison value of the plurality of comparison values, determining if the difference value and the additional difference value are positive or negative; and identifying an increased likelihood of the candidate metering device being out of calibration in response to determining the difference value and the additional difference value are both positive or both negative.

2. The method of claim 1 further comprising:
calculating the comparison value by summing the power measurement values of at least two metering devices of the plurality of metering devices.

3. The method of claim 1 further comprising:
in response to determining the difference value is within a tolerance, obtaining a new power measurement value for each metering device of the plurality of metering devices in the hierarchy.

4. The method of claim 1, wherein identifying the candidate metering device as being out of calibration based on the calculated difference value includes:
calculating an uncertainty value of the candidate metering device based on an accuracy value of the candidate metering device and the power measurement value of the candidate metering device; and
calculating an uncertainty value of the comparison value.

5. The method of claim 4, wherein the uncertainty value for the comparison value is calculated by:
calculating a sum-of-squares of a plurality of uncertainty values including the uncertainty value of the comparison value.

6. The method of claim 4 further comprising:
calculating a plurality of difference values including the difference value;
calculating a plurality of uncertainty values including the uncertainty value of the comparison value;
wherein identifying the candidate metering device as being out of calibration based on the difference value includes:
determining whether a smallest difference value of the plurality of difference values exceeds a largest uncertainty value of the plurality of uncertainty values; and
based on the determination, calculating an adjustment to a calibration constant of the candidate metering device.

7. The method of claim 6, further comprising:
adjusting the calibration constant of the candidate metering device in response to identifying the candidate metering device as being out of calibration.

8. The method of claim 1, further comprising:
issuing a calibration warning in response to identifying the candidate metering device as being out of calibration.

9. A system for identifying a meter being out of calibration comprising:
a plurality of metering devices arranged in a hierarchy, the hierarchy including a plurality of levels with at least one of the plurality of metering devices in each of the plurality of levels; and
a controller configured to:
obtain a power measurement value for each of the plurality of metering devices;
select a candidate metering device from one of the plurality of levels of the plurality of metering devices;
calculate a plurality of comparison values for the candidate metering device based on the power measurement values of at least two metering devices of the plurality of metering devices excluding the candidate metering device, wherein at least one of the at least two metering devices is located in a different level in the hierarchy than the candidate metering device and the plurality of comparison values is calculated based on at least two different sets of one or more metering devices of the plurality of metering devices;
calculate a difference value between the power measurement value of the candidate metering device and a first comparison value of the plurality of comparison values; and
identify the candidate metering device as being out of calibration based on the difference value by: calculating an additional difference value between the power measurement value of the candidate metering device and an additional comparison value of the plurality of comparison values, determining if the difference value and the additional difference value are positive or negative; and
identifying an increased likelihood of the candidate metering device being out of calibration in response to determining the difference value and the additional difference value are both positive or both negative.

10. The system of claim 9 wherein the controller is further configured to:
calculate the comparison value by summing the power measurement values of at least two metering devices of the plurality of metering devices.

11. The system of claim 9 wherein the controller is further configured to:
in response to determining the difference value is within a tolerance, obtain a new power measurement value for each metering device of the plurality of metering devices in the hierarchy.

12. The system of claim 9, wherein the controller is further configured to:
calculate an uncertainty value of the candidate metering device based on an accuracy value of the candidate metering device and the power measurement value of the candidate metering device; and
calculate an uncertainty value of the comparison value.

13. The system of claim 12, wherein the uncertainty value for the comparison value is calculated by:
calculating a sum-of-squares of a plurality of uncertainty values including the uncertainty value of the comparison value.

14. The system of claim 12 wherein the controller is further configured to:
calculate a plurality of difference values including the difference value;
calculate a plurality of uncertainty values including the uncertainty value of the comparison value;
determine whether a smallest difference value of the plurality of difference values exceeds a largest uncertainty value of the plurality of uncertainty values; and
based on the determination, calculate an adjustment to a calibration constant of the candidate metering device.

15. The system of claim 14 wherein the controller is further configured to:
adjust the calibration constant of the candidate metering device in response to identifying the candidate metering device as being out of calibration; or
issue a calibration warning in response to identifying the candidate metering device as being out of calibration.

16. A non-transitory computer-readable medium storing sequences of instructions executable by at least one processor, the sequence of instructions instructing the at least one processor to execute a process of identifying a meter that is out of calibration, the sequences of instructions causing the at least one processor to perform operations comprising:
obtaining a power measurement value for each of a plurality of metering devices arranged in a hierarchy, the hierarchy including a plurality of levels with at least one of the plurality of metering devices in each of the plurality of levels;
selecting a candidate metering device from one of the plurality of levels of the plurality of metering devices;
calculating a plurality of comparison values for the candidate metering device based on the power measurement values of at least two metering devices of the plurality of metering devices excluding the candidate metering device, wherein at least one of the at least two metering devices is located in a different level in the hierarchy than the candidate metering device and the plurality of comparison values is calculated based on at least two different sets of one or more metering devices of the plurality of metering devices;
calculating a difference value between the power measurement value of the candidate metering device and a first comparison value of the plurality of comparison values; and
identifying the candidate metering device as being out of calibration based on the difference value by: calculating an additional difference value between the power measurement value of the candidate metering device and an additional comparison value of the plurality of comparison values, determining if the difference value and the additional difference value are positive or negative; and identifying an increased likelihood of the candidate metering device being out of calibration in response to determining the difference value and the additional difference value are both positive or both negative.

17. A method of identifying a meter that is out of calibration comprising acts of:
obtaining a power measurement value for each of a plurality of metering devices arranged in a hierarchy, the hierarchy including a plurality of levels with at least one of the plurality of metering devices in each of the plurality of levels;

selecting a candidate metering device from one of the plurality of levels of the plurality of metering devices;

calculating a plurality of comparison values for the candidate metering device based on the power measurement values of at least two metering devices of the plurality of metering devices excluding the candidate metering device, wherein at least one of the at least two metering devices is located in a different level in the hierarchy than the candidate metering device and the plurality of comparison values is calculated based on at least two different sets of one or more metering devices of the plurality of metering devices;

calculating a difference value between the power measurement value of the candidate metering device and a first comparison value of the plurality of comparison values; and identifying the candidate metering device as being out of calibration based on the difference value by calculating an uncertainty value of the candidate metering device based on an accuracy value of the candidate metering device and the power measurement value of the candidate metering device; and calculating an uncertainty value of the comparison value, wherein the uncertainty value for the comparison value is calculated by: calculating a sum-of-squares of a plurality of uncertainty values including the uncertainty value of the comparison value, the method further comprising:

calculating a plurality of difference values including the difference value;

calculating a plurality of uncertainty values including the uncertainty value of the comparison value;

wherein identifying the candidate metering device as being out of calibration based on the difference value includes:

determining whether a smallest difference value of the plurality of difference values exceeds a largest uncertainty value of the plurality of uncertainty values; and based on the determination, calculating an adjustment to a calibration constant of the candidate metering device.

18. The method of claim 17, further comprising:

adjusting the calibration constant of the candidate metering device in response to identifying the candidate metering device as being out of calibration.

19. The method of claim 17, further comprising:

issuing a calibration warning in response to identifying the candidate metering device as being out of calibration.

\* \* \* \* \*